US012772688B2

(12) United States Patent
Xin et al.

(10) Patent No.: US 12,772,688 B2
(45) Date of Patent: Oct. 20, 2026

(54) DISPLAY PANEL AND DISPLAY DEVICE

(71) Applicant: Yungu (Gu'an) Technology Co., Ltd., Langfang (CN)

(72) Inventors: Zhenghang Xin, Langfang (CN); Rusheng Liu, Langfang (CN); Deshun Qu, Langfang (CN); Qi Shan, Langfang (CN); Meng Zhang, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 591 days.

(21) Appl. No.: 17/986,335

(22) Filed: Nov. 14, 2022

(65) Prior Publication Data

US 2023/0075241 A1 Mar. 9, 2023

Related U.S. Application Data

(63) Continuation of application No. PCT/CN2021/099095, filed on Jun. 9, 2021.

(30) Foreign Application Priority Data

Sep. 17, 2020 (CN) ......................... 202010978768.1

(51) Int. Cl.
*H10K 59/35* (2023.01)

(52) U.S. Cl.
CPC .................................. *H10K 59/353* (2023.02)

(58) Field of Classification Search
CPC ........................... H10K 59/353; H10K 59/352
See application file for complete search history.

(56) References Cited

U.S. PATENT DOCUMENTS

2018/0226457 A1* 8/2018 Jin ....................... H10K 59/353
2019/0305057 A1* 10/2019 Cheng .................. H10K 71/166
(Continued)

FOREIGN PATENT DOCUMENTS

CN 101815964 A 8/2010
CN 106716226 A 5/2017
(Continued)

OTHER PUBLICATIONS

International Search Report issued on Aug. 26, 2021, in corresponding International Application No. PCT/CN2021/099095; 11 pages.
(Continued)

*Primary Examiner* — Eric K Ashbahian
(74) *Attorney, Agent, or Firm* — Maier & Maier, PLLC

(57) ABSTRACT

A display panel and display device. A first display area of the display panel is a light-transmitting display area, which includes a first sub-display area and second sub-display area. The display panel includes an array substrate and light-emitting functional layer. The light-emitting functional layer includes first sub-pixels and second sub-pixels. Orthographic projection shapes of the second sub-pixels on the array substrate are identical, at least one of the first sub-pixels is a target sub-pixel, an orthographic projection shape on the array substrate of the target sub-pixel is identical to that of a second sub-pixel, each of orthographic projection shapes of the target sub-pixel and second sub-pixel includes a first center line and second center line that are perpendicular to each other, and the first center line of the orthographic projection shape of the target sub-pixel intersects that of the orthographic projection shape of the second sub-pixel.

20 Claims, 10 Drawing Sheets

(56) References Cited

U.S. PATENT DOCUMENTS

| | | | | |
|---|---|---|---|---|
| 2021/0013274 A1* | 1/2021 | He | | H10K 59/353 |
| 2022/0037423 A1* | 2/2022 | Zhang | | H10K 59/122 |
| 2022/0069037 A1* | 3/2022 | Kim | | H10K 59/122 |
| 2022/0376028 A1* | 11/2022 | Huang | | H10K 59/353 |
| 2023/0096260 A1* | 3/2023 | Zhang | | G02F 1/134309 |
| | | | | 257/40 |
| 2024/0074272 A1* | 2/2024 | Kubota | | H10K 59/876 |

FOREIGN PATENT DOCUMENTS

| | | | |
|---|---|---|---|
| CN | 208607570 | U | 3/2019 |
| CN | 209056269 | U | 7/2019 |
| CN | 110767085 | A | 2/2020 |
| CN | 110783384 | A | 2/2020 |
| CN | 110783386 | A | 2/2020 |
| CN | 110783390 | A | 2/2020 |
| CN | 210120138 | U | 2/2020 |
| CN | 110890026 | A | 3/2020 |
| CN | 111192902 | A | 5/2020 |
| CN | 111192978 | A | 5/2020 |
| CN | 111261684 | A | 6/2020 |
| CN | 111341936 | A | 6/2020 |
| CN | 111402743 | A | 7/2020 |
| CN | 111613659 | A | 9/2020 |
| CN | 112002749 | A | 11/2020 |
| WO | 2019199139 | A1 | 10/2019 |

OTHER PUBLICATIONS

Office Action issued on Apr. 13, 2022, in connection with corresponding Chinese Application No. 202010978768.1 (14 pp., including machine-generated English translation).

* cited by examiner

100

DISPLAY PANEL AND DISPLAY DEVICE

CROSS-REFERENCE TO RELATED APPLICATIONS

The present application is a continuation of International Application No. PCT/CN2021/099095 filed on Jun. 9, 2021, which claims the priority to Chinese patent application No. 202010978768.1 filed on Sep. 17, 2020, both of which are incorporated herein by reference in their entireties.

TECHNICAL FIELD

The present application relates to the technical field of display, and particularly to a display panel and display device.

BACKGROUND

With rapid development of electronic devices, users are requiring to have higher and higher screen-to-body ratios, such that the industry has shown more and more interest in all-screen displays of electronic devices.

In the related art, a display panel may be divided into a main screen area and a secondary screen area. Photosensitive elements can be placed under the secondary screen area and the secondary screen area can also be used to satisfy a display function. However, since the secondary screen area retains film structures, such as light-emitting devices and traces, etc., a diffraction problem of under-screen shoot will be caused when the photosensitive elements are shooting through the secondary screen area, resulting in a decrease in image quality.

SUMMARY

Embodiments of the present application provide a display panel and a display device, which can alleviate the diffraction problem of under-screen shoot and improve image quality.

In a first aspect, an embodiment of the present application provide a display panel including a first display area that is a light-transmitting display area and includes a first sub-display area and a second sub-display area, the display panel including: an array substrate; a light-emitting functional layer, located on a side of an array substrate, a light-emitting functional layer including a plurality of first sub-pixels located in the first sub-display area and a plurality of second sub-pixels located in the second sub-display area; wherein a plurality of orthographic projection shapes of the plurality of second sub-pixels on the array substrate are identical, at least one of the first sub-pixels is a target sub-pixel, an orthographic projection shape of the target sub-pixel on the array substrate is identical to an orthographic projection shape of the second sub-pixel on the array substrate, each of the orthographic projection shape of the target sub-pixel on the array substrate and the orthographic projection shape of the second sub-pixel on the array substrate comprises a first center line and a second center line that are perpendicular to each other, and the first center line of the orthographic projection shape of the target sub-pixel intersects the first center line of the orthographic projection shape of the second sub-pixel.

In a second aspect, an embodiment of the present application provide a display device including at least one photosensitive element and the display panel as described in any embodiment of the first aspect, wherein each of the first sub-display area and the second sub-display area correspond to one of the at least one photosensitive element.

According to the display panel and display device of the embodiments of the present application, at least one of the first sub-pixels in the first sub-display area is a target sub-pixel, the plurality of orthographic projection shapes of the plurality of second sub-pixel on the array substrate are the same, the orthographic projection shape of the target sub-pixel on an array substrate is the same as an orthographic projection shape of the second sub-pixel on the array substrate, each of the orthographic projection shape of the target sub-pixel on the array substrate and the projection shape of the second sub-pixel on the array substrate includes the first center line and the second center line that are perpendicular to each other, and the first center line of the orthographic projection shape of the target sub-pixel intersects the first center line of the orthographic projection shape of the second sub-pixel. That is to say, a slit formed between target sub-pixels can intersect a slit formed between second sub-pixels, so that first diffraction light spots generated by light passing through the first sub-display area can intersect second diffraction light spots generated by light passing through the second sub-display area. Therefore, subsequently, initial images can be acquired through the first sub-display area and the second sub-display area, respectively. Since the diffraction light spots generated by the two sub-display areas intersect each other, positions where the diffraction light spots are located in the two initial images are different, so that the two initial images may be compared and synthesized and image information of positions where the diffraction light spots are located in one of the initial images can be replaced with image information of corresponding positions in the other initial image where no diffraction light spots or weaker diffraction light spots are located. Since two diffraction light spots intersect, the diffraction light spots in the synthesized image can be mitigated or disappear. Therefore, the present application can alleviate the diffraction problem of under-screen shoot and improve image quality.

DETAILED DESCRIPTION

Features and exemplary embodiments of various aspects of the present application will be described in details below. In order to make the objects, technical solutions and advantages of the present application clearer, the present application is further described in details below with reference to the accompany drawings and specific embodiments. It should be understood that the specific embodiments described herein are only intended to explain the present application, but not to limit the present application.

Embodiments of the present application provide a display panel and a display device. Various embodiments of the display panel and the display device will be described below with reference to the accompany drawings.

As shown in FIG. 1-FIG. 8, embodiments of the present application provide a display panel. The display panel may be an Organic Light Emitting Diode (OLED) display panel.

The display panel 100 includes a first display area AA1. The first display area AA1 is a light-transmitting display area. Exemplarily, the whole display area of the display panel 100 can be the first display area AA1, that is, the display panel 100 can be a light-transmitting display panel.

In embodiments of the present application, it is preferable that a light transmittance of the first display area AA1 is greater than or equal to 15%. In order to ensure that the light transmittance of the first display area AA1 is greater than 15%, or even greater than 40% or more, light transmittances of functional film layers in the display panel 100 in the embodiments of the present application may be greater than 50%, or even light transmittances of at least some of the functional film layers may be greater than 90%.

According to the display panel 100 of the embodiments of the present application, the first display area AA1 is the light-transmitting display area, so that photosensitive components may be integrated on the back of the first display area AA1 of the display panel 100 to realize under-screen integration of the photosensitive components such as cameras, while the first display area AA1 can display images. Thus, a display area of the display panel 100 can be increased and a full-screen design of a display device can be realized.

Figure 1:
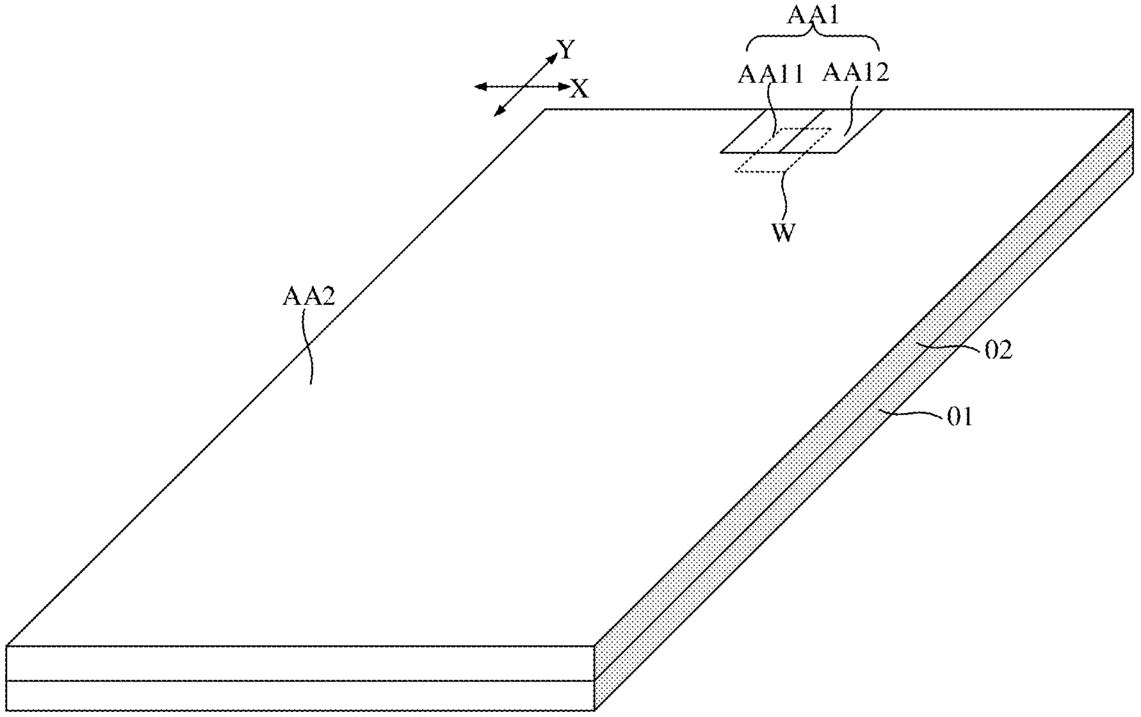
FIG. 1 illustrates a schematic structural view of a display panel according to an embodiment of the present application.
Figure 2:
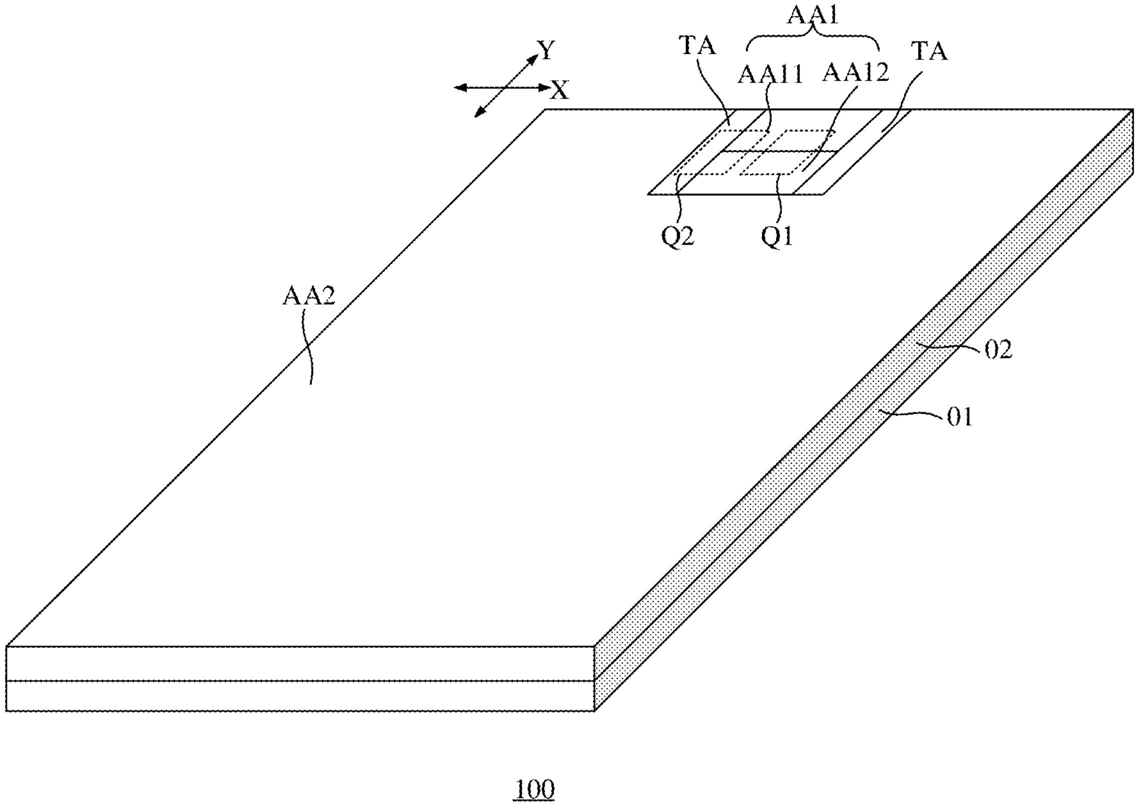
FIG. 2 illustrates a schematic structural view of a display panel according to another embodiment of the present application.

The first display area AA1 may include a first sub-display area AA11 and a second sub-display area AA12. Light transmittances of the first sub-display area AA11 and the second sub-display area AA12 may be the same. As illustrated in FIG. 1, the first sub-display area AA11 and the second sub-display area AA12 can be distributed along a first direction X. As illustrated in FIG. 2, the first sub-display area AA11 and a second sub-display area AA12 can alternatively be distributed along a second direction Y. The first direction X can intersect the second direction Y. Exemplarily, the first direction X may be perpendicular to the second direction Y. The first direction X may be the row direction of the display panel, and the second direction Y may be the column direction of the display panel. The row direction and the column direction may be interchangeable.

The display panel 100 includes an array substrate 01 and a light-emitting functional layer 02 located on a side of the array substrate 01. The array substrate 01 may include first signal lines 10 and second signal lines 20. The light-emitting functional layer 02 includes first sub-pixels 110 and second sub-pixels 210. A plurality of first sub-pixels 110 are located in the first sub-display area AA11 and a plurality of second sub-pixels 210 are located in the second sub-display area AA12.

Exemplarily, the first sub-display area AA11 may include first sub-pixels 110 of at least three colors, and the second sub-display area AA12 may include second sub-pixels 210 of at least three colors. In the drawings of the present application, sub-pixels of the same color are represented by the same hatch pattern. It is illustrated in the drawings that the first sub-display area AA11 includes red first sub-pixels 110R, green first sub-pixels 110G and blue first sub-pixels 110B, and the second sub-display area AA12 includes red second sub-pixels 210R, green second sub-pixels 210G and blue second sub-pixels 210B.

Color types of sub-pixels included in the first sub-display area AA11 and the second sub-display area AA12 can be adjusted according to design needs of the display panel 100, and therefore are not limited to examples of the above embodiments. In addition, arrangements of sub-pixels in the first sub-display area AA11 and the second sub display area AA12 are also not limited to examples in the drawings of the present application.

At least one of the plurality of first sub-pixels 110 in the first sub-display area AA11 is a target sub-pixel 110T. A plurality of shapes formed by orthographic projections of the plurality of second sub-pixel 210 on the array substrate 01 are the same. A shape formed by an orthographic projection of the target sub-pixel 110T on the array substrate 01 and a shape formed by an orthographic projection of the second sub-pixel 210 on the array substrate 01 are the same. For example, the orthographic projection shape on the array substrate 01 of the target sub-pixel 110T and the second sub-pixel 210 are all rectangular shapes, elliptical shapes, triangular shapes, shapes of irregular polygons and the like. Orthographic projection shapes on the array substrate 01 of the other first sub-pixels 110 in the sub-display area AA11 except the target sub-pixel 110T may be the same as or may be different from orthographic projection shapes of the second sub-pixels 210 on an array substrate 01, which is not limited in the present application.

Figure 3:
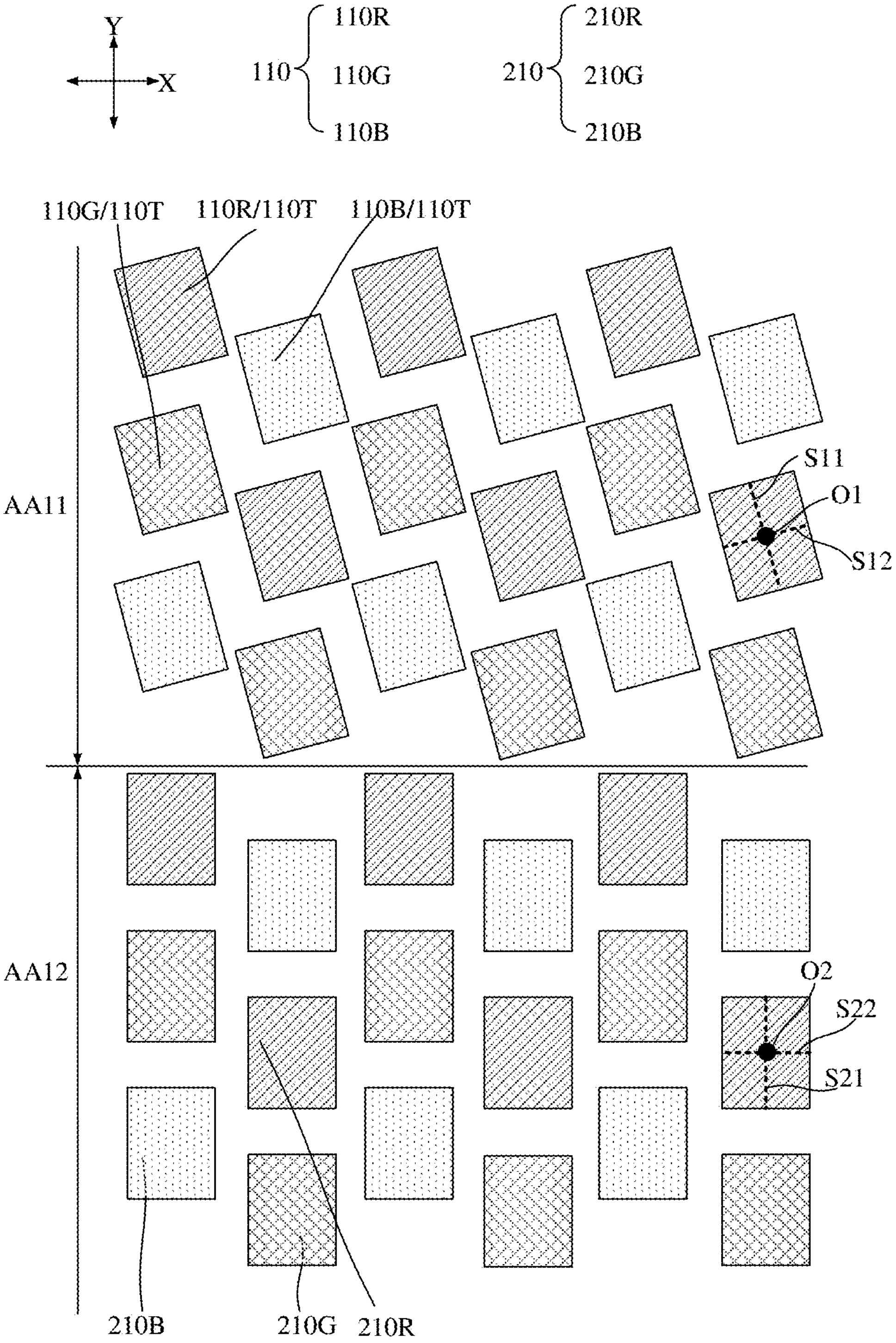
FIG. 3 illustrates a schematic top view of area Q1 in FIG. 2 of an example.

As illustrated in FIG. 3, an orthographic projection shape of a target sub-pixel 110T on the array substrate 01 has a center point O1, and has a first center line S11 and a second center line S12 that pass through its center point O1 and are perpendicular to each other. An orthographic projection shape of a second sub-pixel 210 on an array substrate 01 has a center point O2, and has a first center line S21 and a second center line S22 that pass through its center point O2 and are perpendicular to each other.

It should be understood that as long as the first center line S11 and the second center line S12 pass through the center point O1 of the orthographic projection shape of the target sub-pixel 110T on an array substrate 01 and are perpendicular to each other, the orthographic projection shape of the target sub-pixel 110T may be symmetrical about the first center line S11 or the second center line S12, or may be asymmetrical, which is not limited in the present application. The first center line S21 and the second center line S22 of the orthographic projection shape of the second sub-pixel 210 are in the similar way.

It should also be understood that a position of the first center line S11 of the orthographic projection shape of the target sub-pixel 110T on the orthographic projection shape is the same as that of the first center line S21 of the orthographic projection shape of the second sub-pixel 210 on the orthographic projection shape, and similarly, a position of the second center line S12 of the orthographic projection shape of the target sub-pixel 110T on the orthographic shape the same as that of the second center line S22 of the orthographic projection shape of the second sub-pixel 210 on the orthographic shape, too. For example, in an example that the orthographic projection shape on the array substrate 01 of either the target sub-pixel 110T or the second sub-pixel 210 is a rectangular shape, the first center line S11, S21 may be a line perpendicular to the two short sides of the rectangular shape and passing through the center point of the rectangular shape, and the second center line S12, S22 may be a line perpendicular to the two long sides of the rectangular shape and passing through the center point of the rectangular shape. For another example, in an example that the orthographic projection shape on an array substrate 01 of either the target sub-pixel 110T or the second sub-pixel 210 is an elliptical shape (not illustrated), the first center line S11, S21 may be the long axis of the elliptical shape, and the second center line S12, S22 may be the short axis of the elliptical shape.

The first center line S11 of the orthographic projection shape of the target sub-pixel 110T intersects the first center line S21 of the orthographic projection shape of the second sub-pixel 210. It can be understood that the second center line S12 of the orthographic projection shape of the target sub-pixel 110T intersects the second center line S22 of the orthographic projection shape of the second sub-pixel 210.

Exemplarily, as illustrated in FIG. 3, the first center line S21 of the orthographic projection shape of the second sub-pixel 210 may extend along the second direction Y, and the second center line S22 of the orthographic projection shape of the second sub-pixel 210 may extend along the first direction X that is perpendicular to the second direction Y. The first center line S11 of the orthographic projection shape of the target sub-pixel 110T may intersect both the first direction X and the second direction Y, and the second center line S12 of the orthographic projection shape of the target sub-pixel 110T may intersect both the first direction X and the second direction Y too.

That is to say, the orthographic projection shapes of the target sub-pixel 110T and the second sub-pixels 210 are placed on the array substrate 01 in different angles. That is, the target sub-pixel 110T is rotated by a certain angle relative to second sub-pixel 210.

In embodiments of the present application, the first center line S11 of the orthographic projection shape of the target a sub-pixel 110T is set to intersect the first center line S21 of the orthographic shape of the second sub-pixel 210, i.e., a slit formed between target sub-pixels 110T intersects a slit formed between second sub-pixels 210, so that a first diffraction light spot generated by light passing through the slit between the target sub-pixels 110T intersect a second diffraction light spot generated by light passing through the slit between the second sub-pixels 210, i.e., the first diffraction light spot generated by light passing through the first sub-display area intersects with the second diffraction light spot generated by light passing through the second sub-display area. That is to say, two different diffraction situations happen in the first sub-display area AA11 and the second sub display area AA12, i.e., there is a difference between diffraction light spots generated by the first sub-display area AA11 and the second sub-display area AA12. Therefore, initial images can be acquired subsequently through the first sub-display area AA11 and the second sub-display area AA12, respectively. Since the diffraction light spots generated by the two sub-display areas intersect each other, positions where the diffraction light spots are located in the two initial images are different, so that the two initial images can be compared and synthesized and image information of positions where the diffraction light spots are located in one of the initial images can be replaced with image information of corresponding positions in the other initial image where no diffraction light spots or weaker diffraction light spots are located. Since two diffraction light spots intersect, the diffraction light spots in the synthesized image can be mitigated or disappear. Therefore, the present application can alleviate the diffraction problem of under-screen shoot and improve image quality.

In some optional embodiments, in order to generate two kinds of diffraction light spots that intersect, an angle formed by an intersection of the first center line S11 of the orthographic projection shape of the target sub-pixel 110T and the first center line S21 of the orthographic projection shape of the second sub-pixel 210 should be within a preset range of angles. Exemplarily, the preset range of angles may be 30 degrees~150 degrees. For example, the angle formed by the intersection of the first center line S11 of the orthographic projection shape of the target sub-pixel 110T and the first center line S21 of the orthographic projection shape of the second sub-pixel 210 may be 30 degrees, 45 degrees, 100 degrees, 150 degrees and the like. The angle formed by the intersection of the first center line S11 of the orthographic projection shape of the target sub-pixel 110T and the first center line S21 of the orthographic projection shape of the second sub-pixel 210 is within the preset range of angles, so that differences between the first diffraction light spot generated by light passing through the first sub-display area and the second diffraction light spot generated by light passing through the second sub-display area can be big enough, and thereby diffraction light spots in the synthesized image can be lower than a preset value in subsequent algorithm compensation.

Optionally, the angle formed by the intersection of the first center line S11 of the orthographic projection shape of the target sub-pixel 110T and the first center line S21 of the orthographic projection shape of the second sub-pixel 210 may be 90 degrees, i.e., the first center line S11 of the orthographic projection shape of the target sub-pixel 110T and the first center line S21 of the orthographic projection shape of the second sub-pixel 210 are perpendicular. In that case, differences between the first diffraction light spot generated by light passing through the first sub-display area and the second diffraction light spot generated by light passing through the second sub-display area can be maximized.

It can be understood that, since the second center line and the first center line are perpendicular to each other, an angle formed by an intersection of the second center line S12 of the orthographic projection shape of the target sub-pixel 110T and the second center line S22 of the orthographic projection shape of the second sub-pixel 210 is also the preset range of angles, i.e., 30 degrees~150 degrees.

Figure 4:
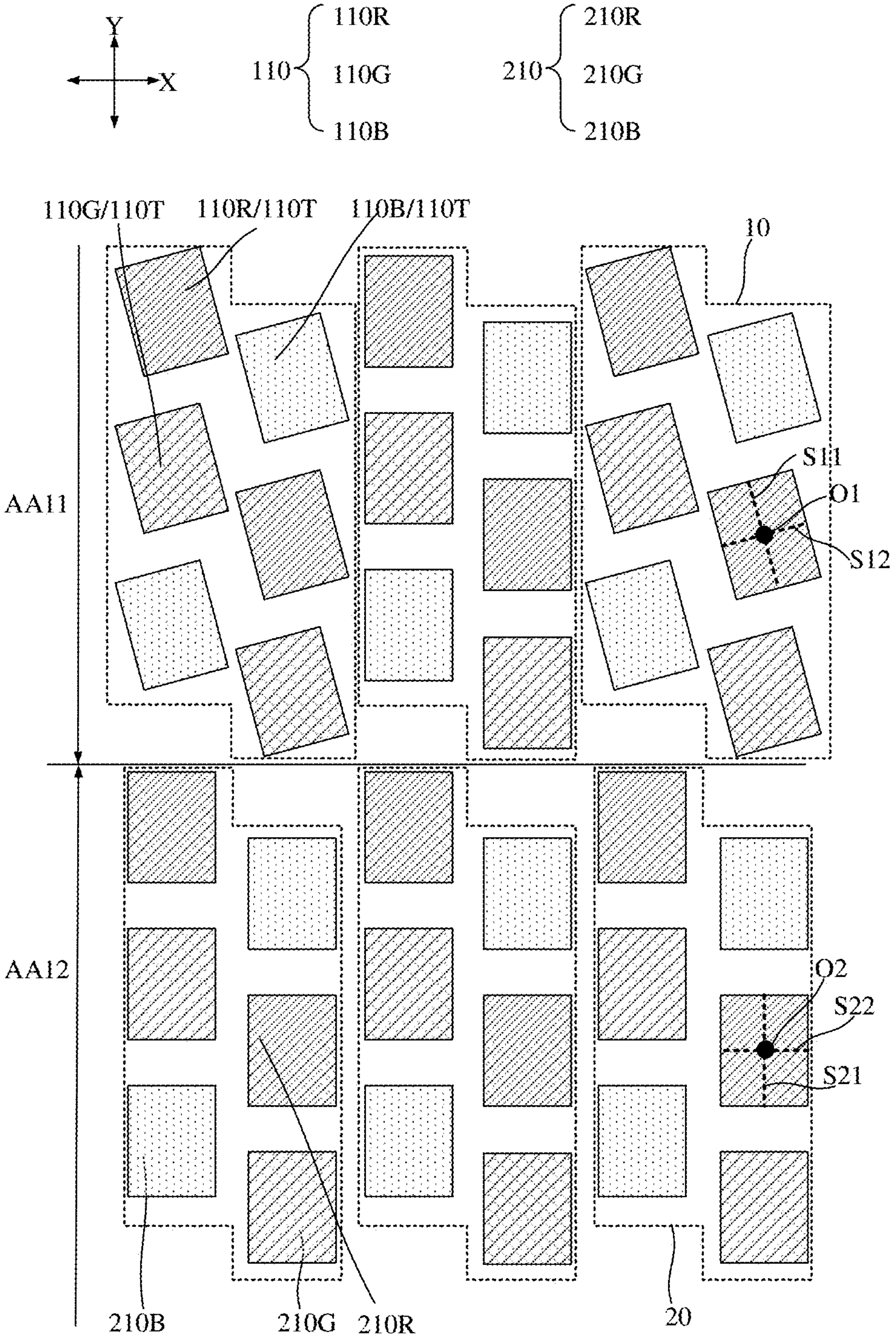
FIG. 4 illustrates a schematic top view of area Q1 in FIG. 2 of another example.

In some optional embodiments, as illustrated in FIG. 4, the display panel 100 may include a plurality of first repeating units 10, each of which includes at least two columns of first sub-pixels 110. As shown in FIG. 4, a first repeating unit 10 includes two columns of first sub-pixels 110, each column includes first sub-pixels 110 of three colors, and two color arranging orders of two adjacent columns of first sub-pixels 110 are different. The display panel 100 may further include a plurality of second repeating units 20. A second repeating unit 20 may include at least two columns of second sub-pixels 210. As shown in FIG. 4, a second repeating unit 20 includes two columns of second sub-pixels 210, each column includes second sub-pixels 210 of three colors, and two color arranging orders of two adjacent columns of second sub-pixels 210 are different. In this way, when displayed actually, the first sub-pixels 110 and the second sub-pixels 210 can be reused twice, and thus the display quality of the first display area AA1 can be improved under a premise that a number of the first sub-pixels 110 and a number of the second sub-pixels 210 in a unit area are not increased.

Exemplarily, an arrangement of first sub-pixels 110 in a first repeating unit 10 may be to the same as an arrangement of second sub-pixels 210 in a second repeating unit 20, that is, the number and arranging order in color of first sub-pixels 110 in a first repeating unit 10 may be the same as the number and arranging order in color of second sub-pixels 210 in a second repeating unit 20.

Further, at least one of the first sub-pixels 110 in the first repeating units 10 is a target sub-pixel 110T, and first center lines S11 of orthographic projection shapes of all target sub-pixels 110T belonging to the same first repeating unit 10 are parallel to each other. That is to say, placement angles of the orthographic projection shapes on an array substrate 01 of target sub-pixels 110T belonging to the same first repeating unit 10 are identical, that is, rotation angles of all the target sub-pixels 110T belonging to the same first repeating unit 10 relative to the second sub-pixels 210 are identical. In an aspect, the first center lines S11 of the orthographic projection shapes of the target sub-pixels 110T belonging to the same first repeating unit 10 are set to be parallel, so that disorders in diffraction light spots of the first sub-display area may be avoided, and therefore it can be avoided that there is no obvious difference between the diffraction light spots generated by the first sub-display AA11 and the second sub-display area AA12; and in another aspect, the complexity of process can be reduced.

Figure 5:
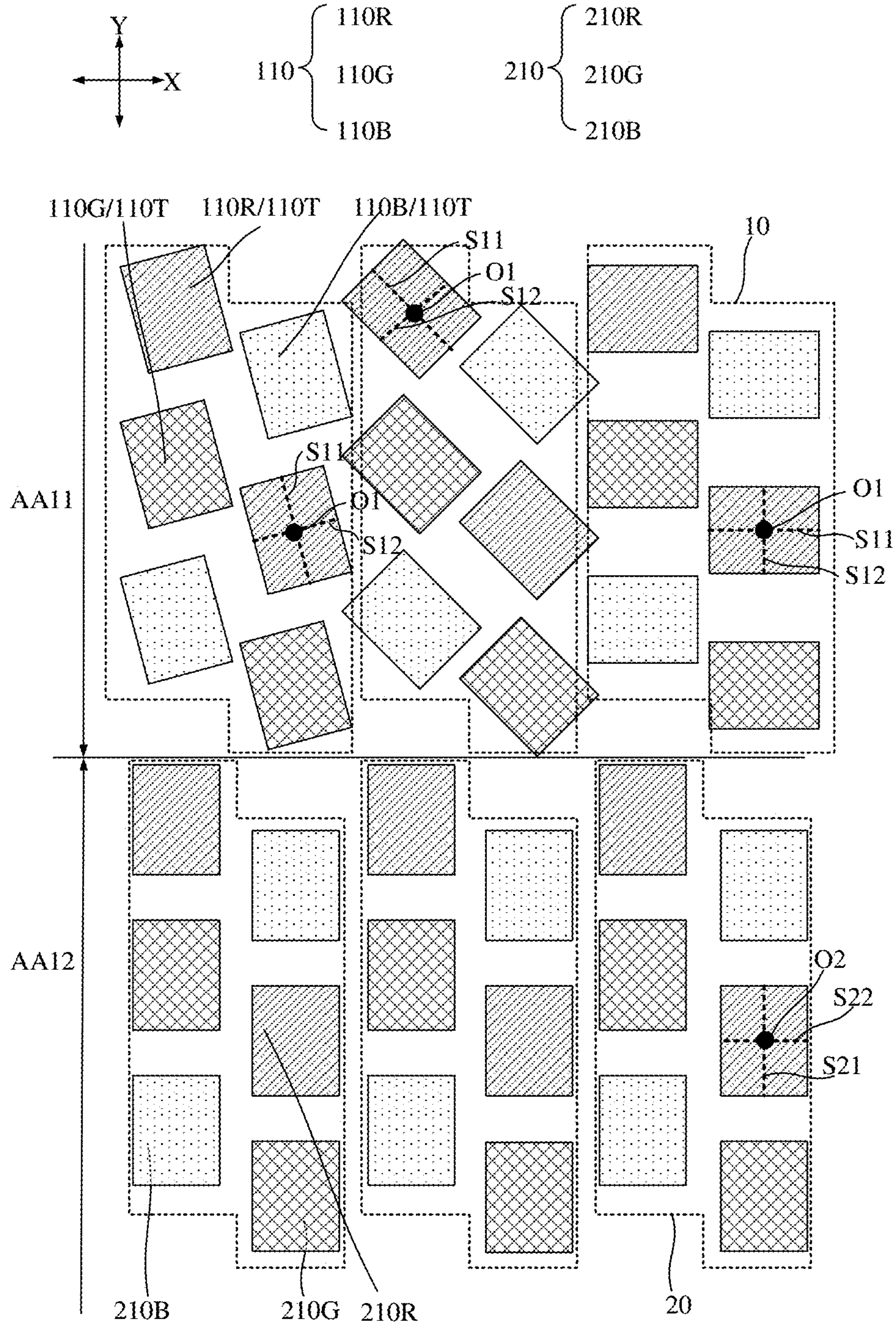
FIG. 5 illustrates a schematic top view of area Q1 in FIG. 2 of another example.

In some optional embodiments, as illustrated in FIG. 5, first center lines S11 of orthographic projection shapes of target sub-pixels 110T belonging to different first repeating units 10 intersect. That is to say, placement angles of orthographic projection shapes on the array substrate 01 of target sub-pixels 110T belonging to different first repeating units 10 are different, i.e., rotation angles of target sub-pixels 110T belonging to different first repeating units 10 relative to second sub-pixels 210 are different. Exemplarily, an angle formed by an intersection of a first center line S11 of an orthographic projection shape of a target sub-pixel 110T of a part of a first repeating unit 10 and a first center line S21 of an orthographic projection shape of a second sub-pixel 210 may be 30 degrees, an angle formed by an intersection of a first center line S11 of an orthographic projection shape of a target sub-pixel 110T of a part of a first repeating unit 10 and a first center line S21 of an orthographic projection shape of a second sub-pixel 210 may be 60 degrees, an angle formed by an intersection of a first center line S11 of an orthographic projection shape of a target sub-pixel 110T of a part of a first repeating unit 10 and a first center line S21 of an orthographic projection shape of a second sub-pixel 210 may be 90 degrees, and the like.

The first center lines S11 of the orthographic projection shapes of the target sub-pixels 110T belonging to the different first repeating units 10 are set to intersect each other, so that it can be avoided that all first sub-pixels 110 in the first sub-display area AA11 are placed according to one rule, and therefore the diffraction phenomenon of the first sub-display area AA11 itself can be reduced, while there are differences between the diffraction light spots generated by the first sub-display area AA11 and the second sub-display area AA12.

In some optional embodiments, sizes of the orthographic projection shapes of the target sub-pixels 110T on the array substrate 01 are to the same as sizes of the orthographic projection shapes of the second sub-pixels 210 on the array substrate 01. In this way, influencing factors of diffraction of the first sub-display area AA11 and the second sub display area AA12 can be concentrated on differences in the placement angles, so as to avoid that there is no obvious difference between diffraction light spots generated by the first sub-display area AA11 and the second sub display area AA12.

Figure 6:
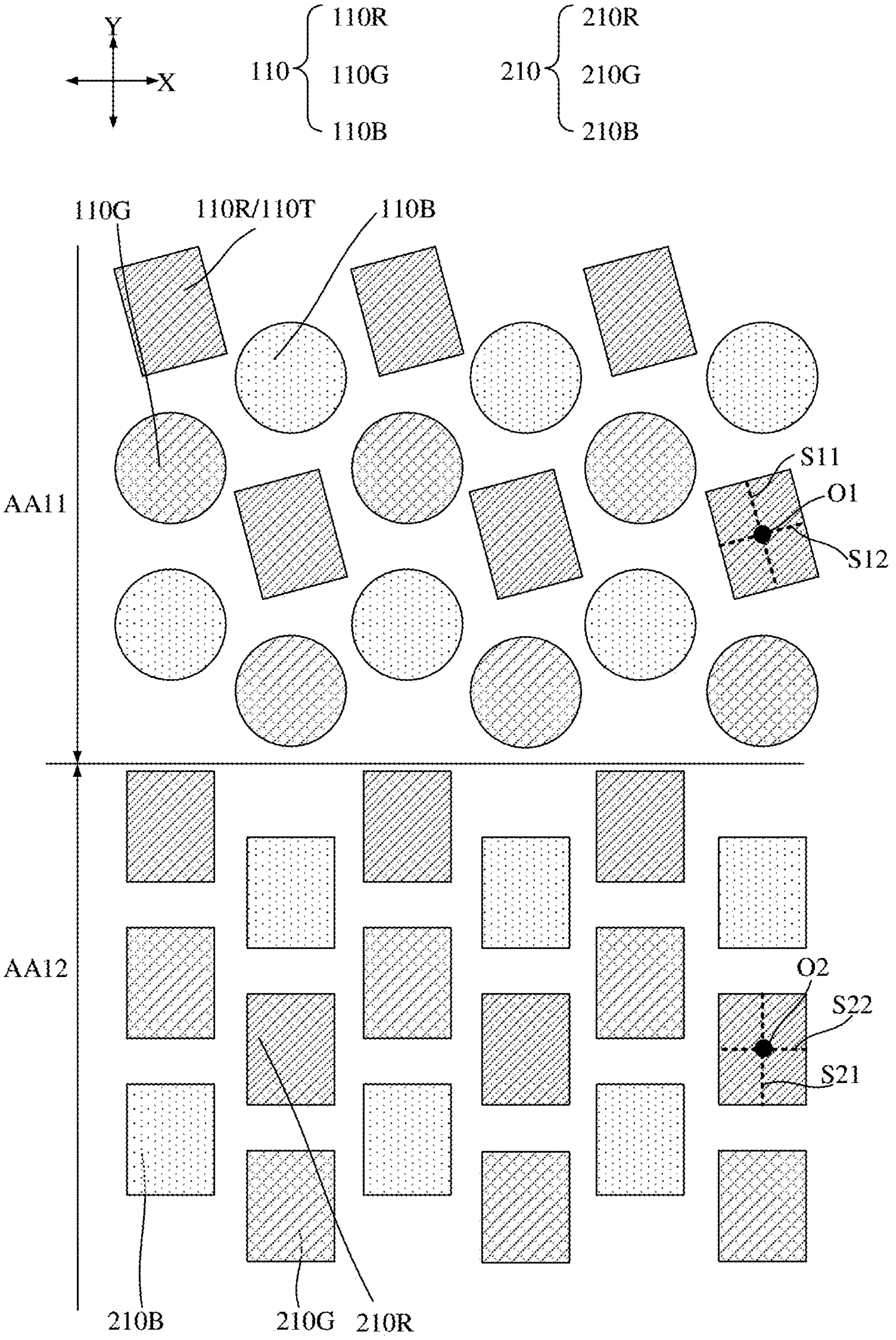
FIG. 6 illustrates a schematic top view of area Q1 in FIG. 2 of another example.

In some optional embodiments, as described above, the first sub-pixels 110 can have at least three colors. The drawings of the present application illustrate that the first sub-pixels 110 include red first sub-pixels 110R, green first sub-pixels 110G and blue first sub-pixels 110B. First sub-pixels 110 of at least one color are target sub-pixels 110T. For example, as illustrated in FIG. 6, the red first sub-pixels 110R can be selected as the target sub-pixels 110T. Of course, the green first sub-pixels 110 G or the blue first sub-pixels 110B can be selected as the target sub-pixels 110T. It is also possible to select first sub-pixels of two colors as the target sub-pixels 110T, which is not limited in this application.

Orthographic projection shapes of first sub-pixels 110 of other colors on the array substrate 01 are either circular shapes or square shapes. For example, as illustrated in FIG. 6, the red first sub-pixels 110R are the target sub-pixels 110T, orthographic projection shapes of green first sub-pixels 110G on the array substrate 01 and orthographic projection shapes of blue first sub-pixels 110B on the array substrate 01 are set to be circular shapes or square shapes.

Inventors of the present application found that when orthographic projection shapes of sub-pixels on the array substrate 01 are set to be circular shapes or square shapes, the diffraction phenomenon is not obvious. Therefore, according to embodiments of the present application, the diffraction phenomenon of the first sub-display area AA11 itself can be reduced, while there are differences between the diffraction light spots generated by the first sub-display area AA11 and the second sub-display area AA12.

Figure 7:
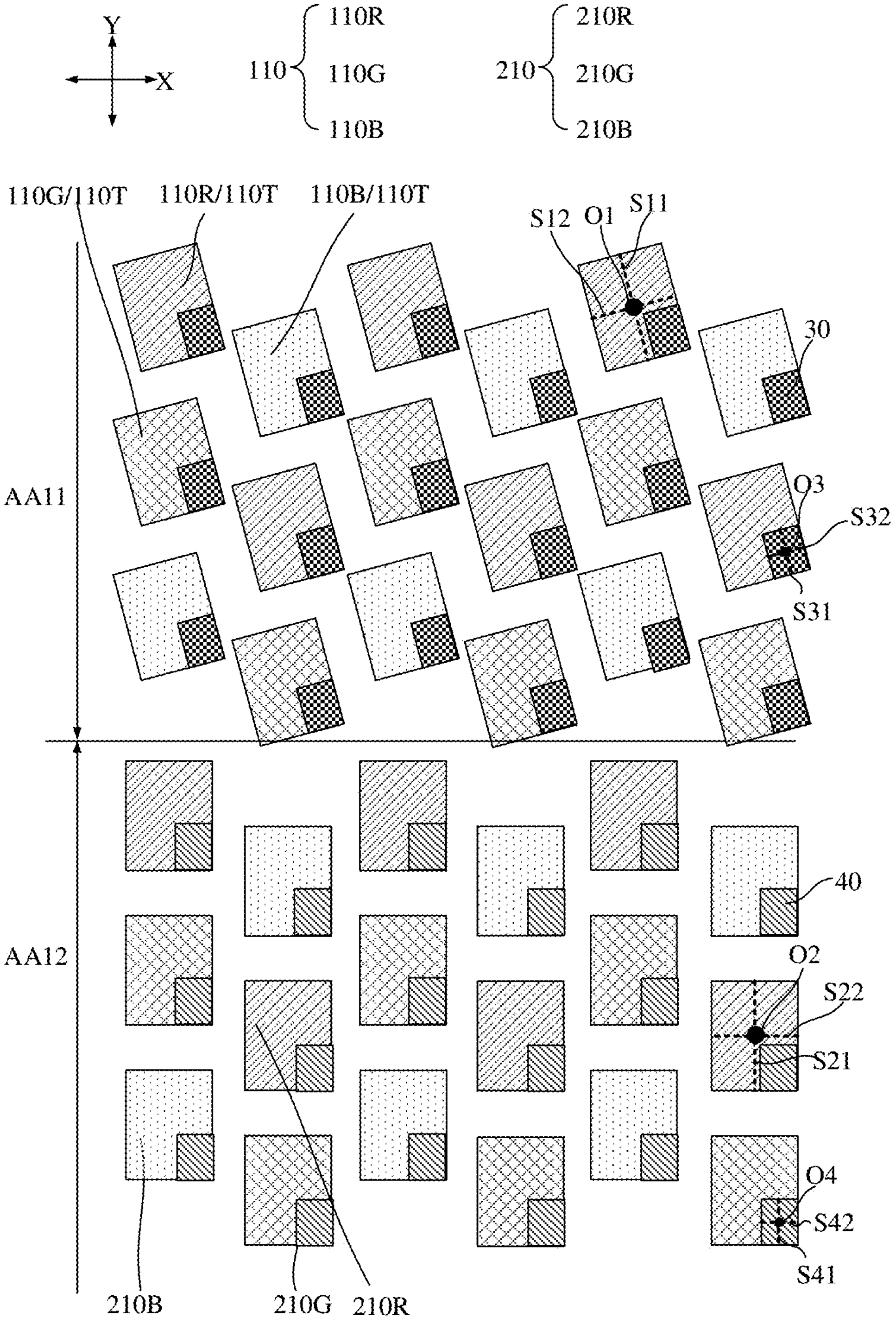
FIG. 7 illustrates a schematic top view of area Q1 in FIG. 2 of another example.

In some optional embodiments, as illustrated in FIG. 7, the array substrate 01 may include at least one first pixel circuit 30 and at least one second pixel circuit 40. The first pixel circuit 30 may be electrically connected to the first sub-pixels 110 and the second pixel circuit 40 may be electrically connected to the second sub-pixels 210. The first pixel circuit 30 may be located in the first sub-display area AA11, and the second pixel circuit 40 may be located in the second sub-display AA12.

In some embodiments, the first pixel circuit 30 and the second pixel circuit 40 may have the same circuit structure. The circuit structure may be any one of the 2T1C circuit, 7T1C circuit, 7T2C circuit, or 9T1C circuit. Herein, the "2T1C circuit" refers to a pixel circuit including 2 thin film transistors (T) and 1 capacitor (C) therein, and the others, i.e., the "7T1C circuit", "7T2C circuit", "9T1C circuit" are similar.

Orthographic projection shapes of the first pixel circuit 30 and the second pixel circuit 40 on the array substrate 01 may be the same. For example, the orthographic projection shapes of the first pixel circuit 30 and the second pixel circuit 40 on the array substrate 01 may be rectangular shapes, elliptical shapes, triangular shapes, shapes of irregular polygons, and the like.

An orthographic projection shape of the first pixel circuit 30 on the array substrate 01 may include a center point O3, and include a third center line S31 and a fourth center line S32 passing through its center point O3 and perpendicular to each other. An orthographic projection shape of the second pixel circuit 40 on the array substrate 01 may include a center point O4, and include a third center line S41 and a fourth center line S42 passing through its center point O4 and perpendicular to each other.

Similarly, as long as a third center line and a fourth center line pass through a center point of an orthographic projection shape of a pixel circuit and are perpendicular to each other, the orthographic projection shape of the pixel circuit may be symmetrical about the third center line or the fourth center line, or may be asymmetrical, which is not limited in the present application.

A third center line S31 of an orthographic projection shape of the first pixel circuit 30 may be parallel to a first center line S11 of an orthographic projection shape of a target sub-pixel 110T. It can be understood that a fourth center line S32 of the orthographic projection shape of the first pixel circuit 30 may be parallel to a second center line S12 of the orthographic projection shape of the target sub-pixel 110, too. That is to say, a placement angle of the orthographic projection shape of the first pixel circuit 30 on the array substrate 01 is the same as a placement angle of the orthographic projection shape of the target sub-pixel 110T on the array substrate 01.

A third center line S41 of an orthographic projection shape of a second pixel circuit 40 may be parallel to a first center line S21 of an orthographic projection shape of a second sub-pixel 210. It can be understood that a fourth center line S42 of the orthographic projection shape of the second pixel circuit 40 may be parallel to a second center line S22 of the orthographic projection shape of the second sub-pixel 210, too. That is to say, a placement angle of the orthographic projection shape of the second pixel circuit 40 on an array substrate 01 is the same as a placement angle of the orthographic projection shape of the second sub-pixel 210 on the array substrate 01.

Light transmittances of elements in the pixel circuits are relatively low, and therefore the pixel circuits may have relatively strong influences on diffraction. Placement angles of orthographic projection shapes of pixel circuits and sub-pixels in an individual sub-display area on the array substrate can be set to be the same, so that the diffraction light spots of the first sub-display area AA11 and the second sub-display area AA12 can be prevented from having multiple directions, so as to avoid that there is no obvious difference between diffraction light spots generated by the first sub-display area AA11 and the second sub display area AA12.

Figure 8:
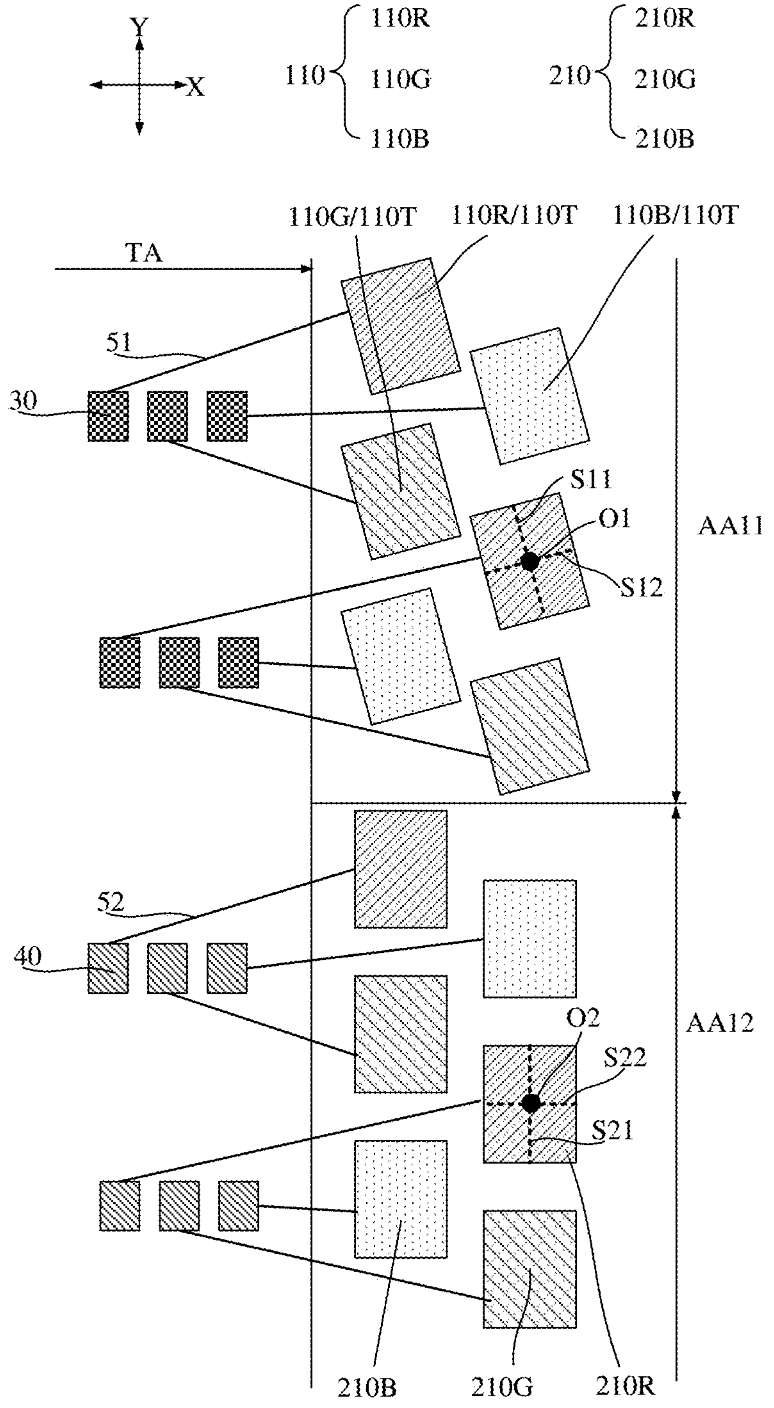
FIG. 8 illustrates a schematic top view of area Q2 in FIG. 2 of another example.

In other optional embodiments, as shown in FIG. 2 and FIG. 8, the display panel 100 may further include a second display area AA2 and a transitional display area TA located between the first display area AA1 and the second display area AA2. A light transmittance of the first display area AA1 may be higher than that of the second display area AA2. The first pixel circuit 30 and the second pixel circuit 40 may be located in the transitional display area TA, and the first pixel circuit 30 may be electrically connected to the first sub-pixel 110 through a first transparent connecting wire 51, and the second pixel circuit 40 may be electrically connected to the second sub-pixel 210 through a second transparent connecting wire 52.

As mentioned above, light transmittances of elements in the pixel circuits are relatively low, and therefore the pixel circuits may have relatively strong influences on diffraction. The first pixel circuit 30 and the second pixel circuit 40 are set in the transitional display area TA, so that, in one aspect, diffraction in the first sub-display area and the second sub-display area can be completely avoided, and in another aspect, the light transmittances of the first sub-display area and the second sub-display area can be improved to further improve the image quality.

Figure 9:
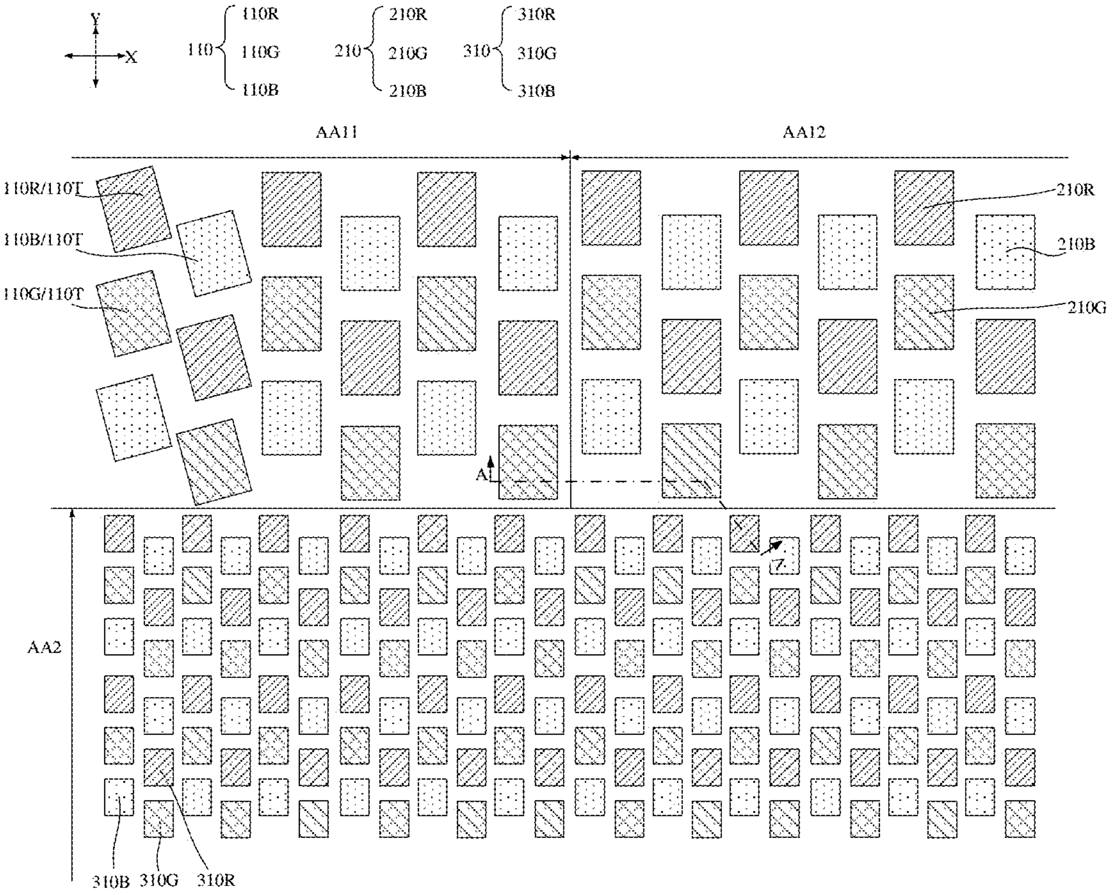
FIG. 9 illustrates a schematic top view of area W in FIG. 1 of an example.

In some optional embodiments, as illustrated in FIG. 9, the light-emitting functional layer 02 may further include third sub-pixels 310. A plurality of third sub-pixels 310 may be located in the second display area AA2. Orthographic projection shapes of the first sub-pixels 110, the second sub-pixels 210 and the third sub-pixels 310 on the array substrate 01 may all be the same. In this way, the sub-pixels in different display areas can be formed using the same mask, so that process costs can be reduced, while two differentiated kinds of diffraction light spots are generated.

Exemplarily, as further shown in FIG. 9, Pixels Per Inch (PPI) of the first display area AA1 can be lower than Pixels Per Inch (PPI) of the second display area AA2. The PPI of the first sub-display area AA11 can be identical to the PPI of the second sub-display area AA12. In addition, in order to reduce display differences between the first display area AA1 and the second display area AA2, a size of the first sub-pixel 110 within the first display area AA1 may be larger than a size of the third sub-pixel 310, and a size of the second sub-pixel 210 within the first display area AA1 may be larger than a size of the third sub-pixel 310.

Figure 10:
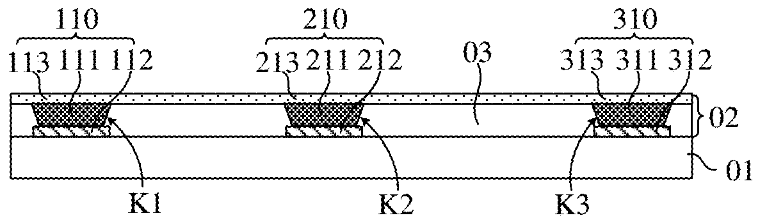
FIG. 10 illustrates a schematic cross-sectional view long an A-A direction in FIG. 9 of an example.

In some optional embodiments, as illustrated in FIG. 10, the light-emitting functional layer 02 may further include a pixel definition structure 03. The pixel definition structure 03 may include a first pixel opening K1 located in the first sub-display area AA11, a second pixel opening K2 located in the second sub-display area AA12, and a third pixel opening K3 located in the second display area AA2.

A first sub-pixel 110 may include a first electrode 112, a first light-emitting layer 111 and a second electrode 113 that are stacked. The first light-emitting layer 111 may be located in the first pixel opening K1, and the first light-emitting layer 111 may be located between the first electrode 112 and the second electrode 113, and the first electrode 112 may be located between the second electrode 113 and the array substrate 01. One of the first electrode 112 and the second electrode 113 may be an anode, and the other one may be a cathode.

The second sub-pixel 210 may include a third electrode 212, a second light-emitting layer 211 and a fourth electrode 213 that are stacked. The second light-emitting layer 211 may be located in the second pixel opening K2, and the second light-emitting layer 211 may be located between the third electrode 212 and the fourth electrode 213, and the third electrode 212 may be located between the fourth electrode 213 and the array substrate 01. One of the third electrode 212 and the fourth electrode 213 is may be anode, and the other one may be a cathode.

The third sub-pixel 310 may include a fifth electrode 312, a third light-emitting layer 311 and a sixth electrode 313 that are stacked. The third light-emitting layer 311 may be located in the third pixel opening K3, and the third light-emitting layer 311 may be located between the fifth electrode 312 and the sixth electrode 313, and the fifth electrode 312 may be located between the sixth electrode 313 and the array substrate 01. One of the fifth electrode 312 and the sixth electrode 313 may be an anode, and the other one may be a cathode.

In this embodiment, an example is illustrated where the first electrode 112, the third electrode 212 and the fifth electrode 312 are anodes, and the second electrode 113, the fourth electrode 213 and the sixth electrode 313 are cathodes. In some embodiments, the second electrode 113, the fourth electrode 213, and the sixth electrode 313 may be interconnected as a common electrode.

Generally, since light transmittances of the first light-emitting layer 111, the second light-emitting layer 211, the third light-emitting layer 311, and the second electrode 113, the fourth electrode 213, the sixth electrode 313 may be relatively high, these film layers may have less influences on diffraction, while since light transmittances of the first electrode 112, the third electrode 212, and the fifth electrode 312 are relatively low, these film layers may have stronger influences on diffraction. Based on this, an orthographic projection shape of a first sub-pixel 110 on the array substrate 01 may include an orthographic projection shape of a first electrode 112 on the array substrate 01, an orthographic projection shape of a second sub-pixel 210 on the array substrate 01 may include an orthographic projection shape of a third electrode 212 on the array substrate 01, and an orthographic projection shape of a third sub-pixel 310 on the array substrate 01 may include an orthographic projection shape of a fifth electrode 312 on the array substrate 01.

Exemplarily, the display panel 100 may further includes an encapsulation layer, and a polarizer and a cover plate located above the encapsulation layer. The cover plate can be disposed directly on the encapsulation layer without the polarizer. Alternatively, the cover plate can be disposed directly on at least the encapsulation layer of the first display area without the polarizer, so as to prevent the polarizer from influencing a light collection amount of a photosensitive element deposited correspondingly under the first display area. Of course, a polarizer can be disposed above the encapsulation layer of the first display area AA1.

An embodiment of the present application further provides a display device, which may include photosensitive components and the display panel 100 of any one of the foregoing embodiments. An embodiment of the display device will be taken as an example for illustration below. In this embodiment, the display device may include the display panel 100 of the above-mentioned embodiments.

Figure 11:
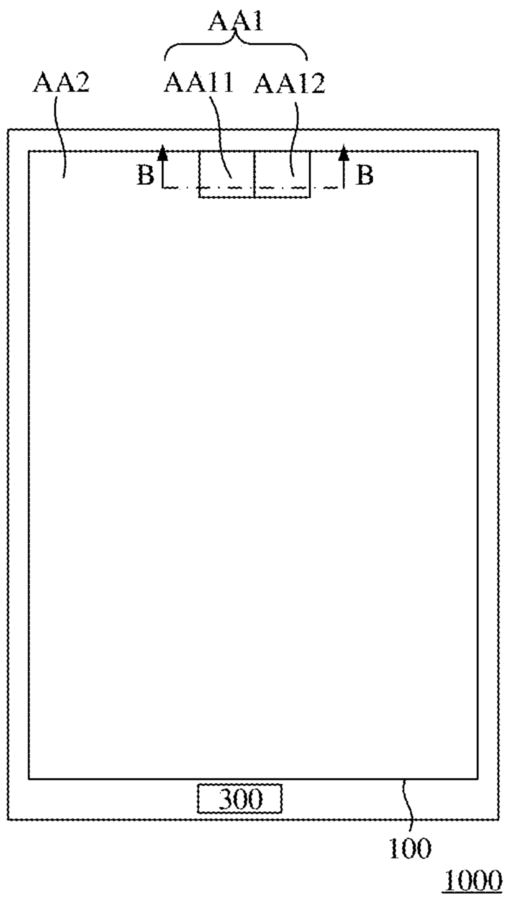
FIG. 11 illustrates a schematic top view of a display device according to an embodiment of the present application.
Figure 12:
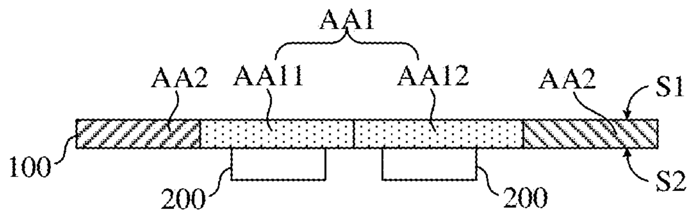
FIG. 12 illustrates a schematic cross-sectional view along a B-B direction in FIG. 11.

FIG. 11 illustrates a schematic top view of a display device according to an embodiment of the present application, and FIG. 12 illustrates a schematic cross-sectional view along a B-B direction in FIG. 11. In the display device 1000 of this embodiment, a display panel 100 may be the display panel 100 in one of the above-mentioned embodiments; the display panel 100 may include a first display area AA1 and a second display area AA2, and a light transmittance of the first display area AA1 may be greater than that of the second display area AA2.

The display panel 100 may include a first surface S1 and a second surface S2 that are opposite to each other. The first surface S1 may be a display surface. The display device may further include photosensitive component(s) 200 located on the second surface S2 of the display panel 100. A number of the photosensitive component(s) 200 may be two. One of the components 200 may correspond to a position of the first sub-display area AA11, and the other one of photosensitive components 200 may correspond to a position of the second sub-display AA12.

The two photosensitive components 200 can identify first diffraction light spots generated by the first sub-display area AA11 and second diffraction light spots generated by the second sub-display area AA12, respectively, so that one of two initial images obtained respectively by the two photosensitive components 200 can contain information about the first diffraction light spots and the other one can contain information about the second diffraction light spots.

The photosensitive components 200 may be image collection devices used for collecting external image information. In this embodiment, the photosensitive components 200 may be Complementary Metal Oxide Semiconductor (CMOS) image collection devices, and in some other embodiments, the photosensitive components 200 may be other forms of image collection devices such as Charge-coupled Device (CCD) image collection devices.

It can be understood that the display device 1000 provided by the embodiment of the present application may be a dual-camera display device. In some embodiments, the display device 1000 may further include an image processing module 300 that is electrically connected to both of the two photosensitive components 200. Specifically, when the display device is shooting, two cameras can work simultaneously to each obtain an initial image. An initial image shot by a camera corresponding to the first sub-display area may capture the first diffraction light spots, an initial image shot by a camera corresponding to the second sub-display area may capture the second diffraction light spots, and the two kinds of diffraction light spots intersect, i.e., there are differences between the diffraction light spots of the first sub-display area and the diffraction light spots of the second sub-display area. The image processing module 300 can identify the differences through a under-screen shooting algorithm, compare and synthesize shooting information of the two initial images, and replace image information of positions where the diffraction light spots are located in one of the initial image with image information of corresponding positions in the other initial image where no diffraction light spots or weaker diffraction light spots are located, so that since two diffraction light spots intersect, the diffraction light spots in synthesized image can be mitigated or disappear.

Specifically, a Modulation Transfer Function (MTF) or a Spatial Frequency Response (SFR) of an image can be used to evaluate an influence of diffraction light spots in the image. The smaller of the influence of diffraction light spots is, the higher the MTF or the SFR of the image will be, and the higher a resolution of the image will be, i.e., the clearer the image will be.

This specification described these embodiments specifically in order to better explain principles and practical applications of the present application, so that those skilled in the art can make good use of the present application and modifications based on the present application. The scope of the present application is limited only by the appended claims.

What is claimed is:

1. A display panel comprising:

a first display area configured to transmit light that comprises a first sub-display area and a second sub-display area;

an array substrate; and a light-emitting functional layer, located on a side of the array substrate, the light-emitting functional layer comprising:

a plurality of first sub-pixels located in the first sub-display area;

a plurality of second sub-pixels located in the second sub-display area a plurality of first repeating units, wherein each first repeating unit of the plurality of first repeating units comprises at least two columns of first sub-pixels of the plurality of first sub-pixels and at least one first sub-pixel of each first repeating unit is a target sub-pixel; and a plurality of second repeating units, wherein each second repeating unit of the plurality of second repeating units comprises at least two columns of second sub-pixels of the plurality of second sub-pixels, wherein an arrangement of first sub-pixels in each first repeating unit matches an arrangement of second sub-pixels in each second repeating unit, a plurality of orthographic projection shapes of the plurality of second sub-pixels on the array substrate are identical, an orthographic projection shape of the target sub-pixel on the array substrate is identical to an orthographic projection shape of the second sub-pixel on the array substrate, each orthographic projection shape of the target sub-pixel on the array substrate and each orthographic projection shape of the second sub-pixel on the array substrate comprises a first center line and a second center line that are perpendicular to each other, and a first center line of the orthographic projection shape of the target sub-pixel intersects a first center line of the orthographic projection shape of the second sub-pixel wherein the plurality of first sub-pixels have at least three colors, and the target sub-pixel has one color of the at least three colors;

wherein a plurality of first center lines of the orthographic projection shapes of all of the target sub-pixels belonging to a first one of the plurality of first repeating units intersect with a plurality of first center lines of the orthographic projection shapes of all of the target sub-pixels belonging to a second one of the plurality of first repeating units different from the first one, wherein the orthographic projection shape of the target sub-pixel is a rectangular shape, the first center line of the orthographic projection shape of the target sub-pixel is a line perpendicular to two short sides of the rectangular shape and passing through a center point of the rectangular shape.

2. The display panel of claim 1, wherein an angle formed by an intersection of the first center line of the orthographic projection shape of the target sub-pixel and the first center line of the orthographic projection shape of the second sub-pixel ranges from 30 degrees to 150 degrees.

3. The display panel of claim 1, wherein a plurality of first center lines of the orthographic projection shapes of the target sub-pixels belonging to a same first repeating unit are parallel.

4. The display panel of claim 1, wherein each column of first sub-pixels of the first repeating unit comprises:

a plurality of first sub-pixels of at least three colors, and two color arranging orders of two adjacent columns of first sub-pixels are different.

5. The display panel of claim 1, wherein each column of second sub-pixels of the second repeating unit comprise a plurality of second sub-pixels of at least three colors, and two color arranging orders of two adjacent columns of second sub-pixels are different.

6. The display panel of claim 1, wherein a size of the orthographic projection shape of the target sub-pixel on the array substrate is identical to a size of the orthographic projection shape of the second sub-pixel on the array substrate.

7. The display panel of claim 1, wherein an orthographic projection shape, on the array substrate, of the first sub-pixel other than the target sub-pixel is circular or square.

8. The display panel of claim 1, wherein the array substrate comprises:

a first pixel circuit electrically connected to the first sub-pixel and located in the first sub-display area; and a second pixel circuit electrically connected to the second sub-pixel and located in the second sub-display area.

9. The display panel of claim 8, wherein each of an orthographic projection shape of the first pixel circuit and an orthographic projection shape of the second pixel circuit on the array substrate comprises a third center line and a fourth center line that are perpendicular to each other, the third center line of the orthographic projection shape of the first pixel circuit is parallel to the first center line of the orthographic projection shape of the target sub-pixel, and the third center line of the orthographic projection shape of the second pixel circuit is parallel to the first center line of the orthographic projection shape of the second sub-pixel.

10. The display panel of claim 1, wherein the array substrate comprises:

a first pixel circuit electrically connected to the first sub-pixel; and a second pixel circuit electrically connected to the second sub-pixel; the display panel further comprises:

a second display area and a transitional display area located between the first display area and the second display area, a light transmittance of the first display area is greater than a light transmittance of the second display area, and the at least one first pixel circuit and the at least one second pixel circuit are located in the transitional display area.

11. The display panel of claim 10, wherein the first pixel circuit is electrically connected to the first sub-pixel through a first transparent connecting wire, and the second pixel circuit is electrically connected to the second sub-pixel through a second transparent connecting wire.

12. The display panel of claim 1, further comprising:

a second display area, a light transmittance of the first display area is greater than a light transmittance of the second display area; and the light-emitting functional layer further comprises a plurality of third sub-pixels located in the second display area, a plurality of orthographic projection shapes of the first sub-pixel, the second sub-pixel and the third sub-pixel on the array substrate are all identical.

13. The display panel of claim 12, wherein the first sub-pixel comprises:

a first electrode, a first light-emitting layer and a second electrode that are stacked, and the first light-emitting layer is located between the first electrode and the second electrode; the second sub-pixel comprises:

a third electrode, a second light-emitting layer, and a fourth electrode that are stacked, and the second light-emitting layer is located between the third electrode and the fourth electrode; and the third sub-pixel comprises:

a fifth electrode, a third light-emitting layer and a sixth electrode that are stacked, and the third light-emitting layer is located between the fifth electrode and the sixth electrode; wherein an orthographic projection shape of the first sub-pixel on the array substrate comprises an orthographic projection shape of the first electrode on the array substrate, an orthographic projection shape of the second sub-pixel on the array substrate comprises an orthographic projection shape of the third electrode on the array substrate, and an orthographic projection shape of the third sub-pixel on the array substrate comprises an orthographic projection shape of the fifth electrode on the array substrate.

14. The display panel of claim 1, wherein the display panel further comprises:

a second display area, the light-emitting functional layer further comprises a plurality of third sub-pixels located in the second display area, and a size of the first sub-pixel in the first display area is larger than a size of the third sub-pixel, and a size of the second sub-pixel in the first display area is larger than a size of the third sub-pixel.

15. A display device, comprising:

at least one photosensitive element; and the display panel according to claim 1, wherein each of the first sub-display area and the second sub-display area corresponds to one of the at least one photosensitive element.

16. The display device of claim 1, wherein the first display area further comprises a first sub-display area and a second sub-display area, and both the first sub-display area and the second sub-display area have matching light transmittances.

17. The display device of claim 1, wherein all first sub-pixels in the plurality of first repeating units are target sub-pixels.

18. The display panel of claim 1, wherein the number and arranging order in color of first sub-pixels in each first repeating unit is the same as the number and arranging order in color of second sub-pixels in each second repeating unit.

19. A display panel comprising:

a first display area configured to transmit light that comprises a first sub-display area and a second sub-display area;

an array substrate; and a light-emitting functional layer, located on a side of the array substrate, the light-emitting functional layer comprising:

a plurality of first sub-pixels located in the first sub-display area;

a plurality of second sub-pixels located in the second sub-display area a plurality of first repeating units, wherein each first repeating unit of the plurality of first repeating units comprises at least two columns of first sub-pixels of the plurality of first sub-pixels and at least one first sub-pixel of each first repeating unit is a target sub-pixel; and a plurality of second repeating units, wherein each second repeating unit of the plurality of second repeating units comprises at least two columns of second sub-pixels of the plurality of second sub-pixels, wherein an arrangement of first sub-pixels in each first repeating unit matches an arrangement of second sub-pixels in each second repeating unit, a plurality of orthographic projection shapes of the plurality of second sub-pixels on the array substrate are identical, an orthographic projection shape of the target sub-pixel on the array substrate is identical to an orthographic projection shape of the second sub-pixel on the array substrate, each orthographic projection shape of the target sub-pixel on the array substrate and each orthographic projection shape of the second sub-pixel on the array substrate comprises a first center line and a second center line that are perpendicular to each other, and a first center line of the orthographic projection shape of the target sub-pixel intersects a first center line of the orthographic projection shape of the second sub-pixel, wherein the plurality of first sub-pixels have at least three colors, and the target sub-pixel has one color of the at least three colors;

wherein a plurality of first center lines of the orthographic projection shapes of all of the target sub-pixels belonging to a first one of the plurality of first repeating units intersect with a plurality of first center lines of the orthographic projection shapes of all of the target sub-pixels belonging to a second one of the plurality of first repeating units different from the first one, wherein the orthographic projection shape of the target sub-pixel is an elliptical shape, the first center line of the orthographic projection shape of the target sub-pixel is a long axis of the elliptical shape.

20. A display panel comprising:

a first display area configured to transmit light that comprises a first sub-display area and a second sub-display area;

an array substrate; and a light-emitting functional layer, located on a side of the array substrate, the light-emitting functional layer comprising:

a plurality of first sub-pixels located in the first sub-display area;

a plurality of second sub-pixels located in the second sub-display area a plurality of first repeating units, wherein each first repeating unit of the plurality of first repeating units comprises at least two columns of first sub-pixels of the plurality of first sub-pixels and at least one first sub-pixel of each first repeating unit is a target sub-pixel; and a plurality of second repeating units, wherein each second repeating unit of the plurality of second repeating units comprises at least two columns of second sub-pixels of the plurality of second sub-pixels, wherein an arrangement of first sub-pixels in each first repeating unit matches an arrangement of second sub-pixels in each second repeating unit, a plurality of orthographic projection shapes of the plurality of second sub-pixels on the array substrate are identical, an orthographic projection shape of the target sub-pixel on the array substrate is identical to an orthographic projection shape of the second sub-pixel on the array substrate, each orthographic projection shape of the target sub-pixel on the array substrate and each orthographic projection shape of the second sub-pixel on the array substrate comprises a first center line and a second center line that are perpendicular to each other, and a first center line of the orthographic projection shape of the target sub-pixel intersects a first center line of the orthographic projection shape of the second sub-pixel, wherein the plurality of first sub-pixels have at least three colors, and the target sub-pixel has one color of the at least three colors;

wherein a plurality of first center lines of the orthographic projection shapes of all of the target sub-pixels belonging to a first one of the plurality of first repeating units intersect with a plurality of first center lines of the orthographic projection shapes of all of the target sub-pixels belonging to a second one of the plurality of first repeating units different from the first one, wherein the orthographic projection shape of the target sub-pixel is a rectangular shape, the first center line of the orthographic projection shape of the target sub-pixel is a line perpendicular to two short sides of the rectangular shape and passing through a center point of the rectangular shape, wherein a slit formed between the target sub-pixels intersects a slit formed between the second sub-pixels.

* * * * *